United States Patent [19]
Sakakibara

[11] Patent Number: 5,862,093
[45] Date of Patent: Jan. 19, 1999

[54] DYNAMIC MEMORY DEVICE WITH CIRCUITS FOR SETTING SELF-REFRESHING PERIOD

[75] Inventor: Kenichi Sakakibara, Tokyo, Japan

[73] Assignee: NEC Corporation, Tokyo, Japan

[21] Appl. No.: 834,294

[22] Filed: Apr. 15, 1997

[51] Int. Cl.[6] ....................................................... G11C 7/00
[52] U.S. Cl. ......................................... 365/222; 365/233
[58] Field of Search .............................. 365/189.01, 233, 365/230.03, 222

[56] References Cited

U.S. PATENT DOCUMENTS

| 5,471,430 | 11/1995 | Sawada et al. | 365/222 |
| 5,495,452 | 2/1996 | Cha | 365/233 |
| 5,717,652 | 2/1998 | Ooishi | 365/233 |

FOREIGN PATENT DOCUMENTS

3-59876  3/1991  Japan .

*Primary Examiner*—Do Hyun Yoo
*Assistant Examiner*—Michael T. Tran
*Attorney, Agent, or Firm*—Sughrue, Mion, Zinn, Macpeak & Seas, PLLC

[57] ABSTRACT

Control signals for refreshing interval selection is simplified and yield in production of a dynamic memory device is improved by a dynamic memory device of the invention. The dynamic memory device includes a refreshing timing signal generating portion for generating first and second refreshing timing signal having mutually different periods, refreshing timing selection means for detecting a time difference of level variation timing of two or three external control signals and generating a refreshing timing selection signal of selected one of first and second levels depending upon the time difference, selector for selecting one of the first and second refreshing timing signal depending upon the level of the refreshing timing selection signal, self-refreshing detecting means for detecting a time condition of level variation timing of a plurality of external control signals and generating an active level self-refreshing entry signal, and an internal address generating means for generating an internal address signal sequentially updated an address value in synchronism with the refreshing timing signal selected by the selector while the self-refreshing entry signal is in active level.

10 Claims, 8 Drawing Sheets

DYNAMIC MEMORY DEVICE WITH CIRCUITS FOR SETTING SELF-REFRESHING PERIOD

BACKGROUND OF THE INVENTION

1. Field of the Invention

The present invention relates generally to a dynamic memory device and a driving method therefor. More specifically, the invention relates to a dynamic memory device having a self-refreshing function and a driving method therefor.

2. Description of the Related Art

In a dynamic memory device having a self-refreshing (hereinafter referred to as "SR") function, after detection of CBR (CAS Before RAS) operation, when both of a row address control signal RAS* (* represents that low level is an active level, hereinafter "*" will be used to represent the same meaning), and a column address control signal CAS* are held in active (low) level, an operation mode is switched into a self-refreshing mode after expiration of a predetermined self-refreshing triggering period to automatically perform refreshing operation for a memory cell array at a predetermined refreshing period.

Figure 7:
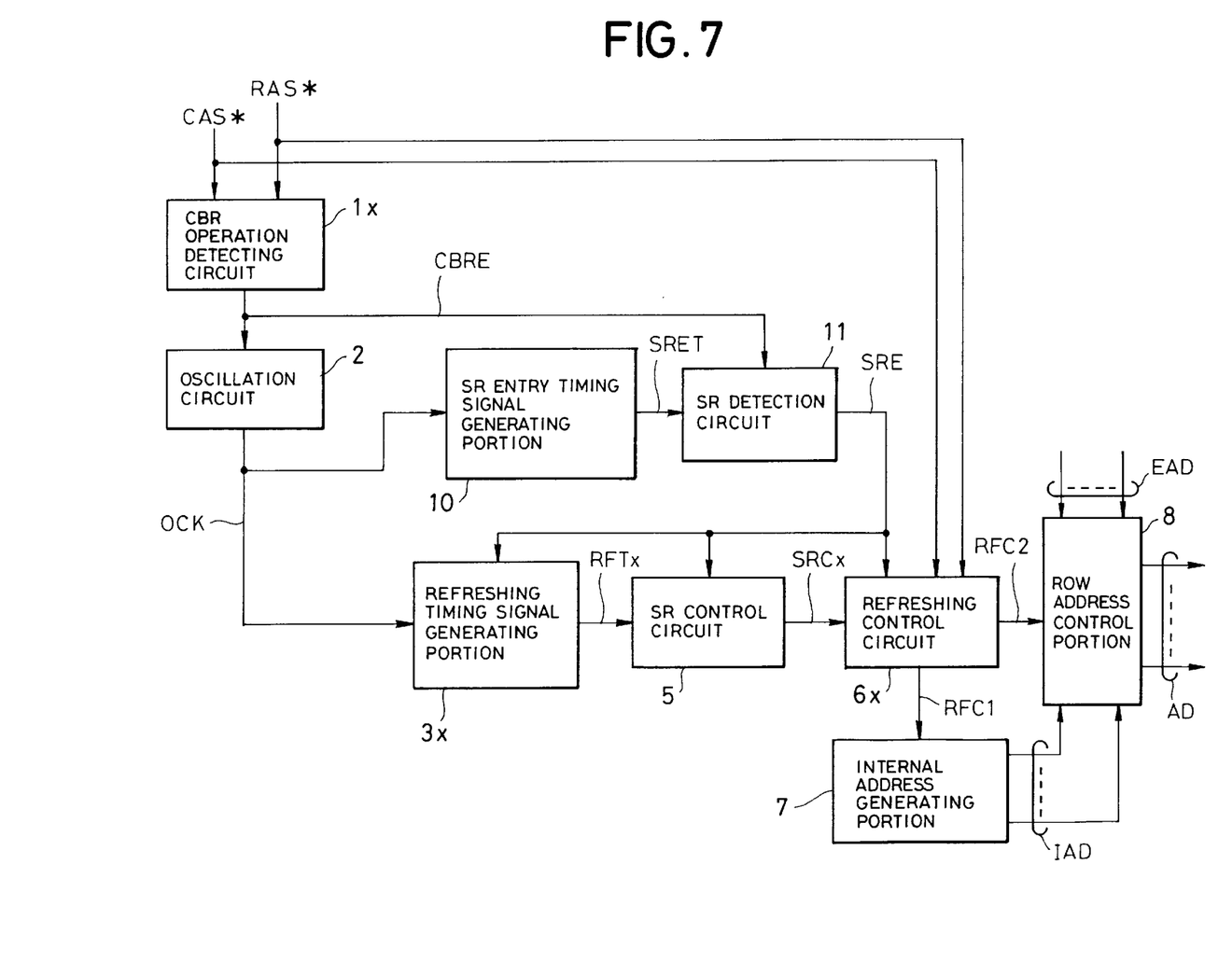
FIG. 7 is a block diagram of the first example of the conventional dynamic memory device.

One example (first example) of the dynamic memory device having the self-refreshing function is illustrated in FIG. 7. The shown dynamic memory device includes a CBR operation detecting circuit 1x outputting a CBR entry signal CBRE which becomes active level by detecting active level of the column address control signal CAS* when the row address control signal RAS* is switched from inactive state (high level) into active level (low level) (CBR operation), and becomes inactive in response to switching of the row address control signal RAS* into inactive level, an oscillation circuit 2 for outputting a predetermined frequency of oscillation clock signal OCK in response to active level of the CBR entry signal CBRE, an SR entry timing signal generating portion 10 for outputting an SR entry timing signal SRET in response to a predetermined count value by counting the oscillation clock signal, an SR detection circuit 11 outputs an active level self-refreshing entry signal SRE when the CBR entry signal CBRE is active when the SR entry timing signal SRET is output, a refresh timing signal generating portion 3x becoming active in response to the active level of the self-refreshing entry signal SRE, counting the oscillation clock signal OCK for generating a predetermined period of self-refreshing entry signal RFTx, an SR control circuit 5 responsive to the active level of the self-refreshing entry signal SRE to output a self-refreshing control signal SRCX of a predetermined width in synchronism with the refreshing timing signal RFTx, to a refreshing control circuit 6x. An internal address generating portion 7 and a row address control circuit 8, after detecting the CBR operation, generate an internal address signal IAD sequentially updated address values in synchronism with the self-refreshing control signal SRCx when the self-refreshing entry signal SRE is active, the internal address signal IAD sequentially updated the address values in synchronism with the row address control signal RAS* of an external control signal when the self-refreshing entry signal SRE is inactive, selecting and outputting an external address signal EAD according to external control signal (RAS*, CAS*), and controlling refreshing operation and so forth of the memory cell array (not shown) when the CBR operation is not detected.

Next, refreshing operation of the dynamic memory device will be discussed in conjunction with the timing chart of the respective signal shown in FIG. 8.

The CBR operation detecting circuit 1x becomes active (high level) by detecting the CBR operation and generates the CBR entry signal CBRE becoming inactive (low level) when the row address control signal RAS* becomes inactive level (high level). In response to the active level of the CBR entry signal CBRE, the oscillation circuit 2 generates the oscillation clock signal OCK.

The SR entry timing signal generating portion 10 counts the oscillation clock signal OCK to output the SR entry timing signal SRET at the predetermined timing. The SR detection circuit 11 makes a judgement that the self-refreshing mode is to begin if the CBR entry signal CBRE is active at an output timing of the SR entry timing signal SRET, and outputs the active level self-refreshing entry signal SRE.

The refreshing timing signal generating portion 3x becomes active when the self-refreshing entry signal SRE becomes active to generate the predetermined period of refreshing timing signal RFTx by counting the oscillation clock signal OCK. The SR control circuit 5 outputs a predetermined period of the self-refreshing control signal SRCX in synchronism with the refreshing timing signal RFTx.

Figure 8:
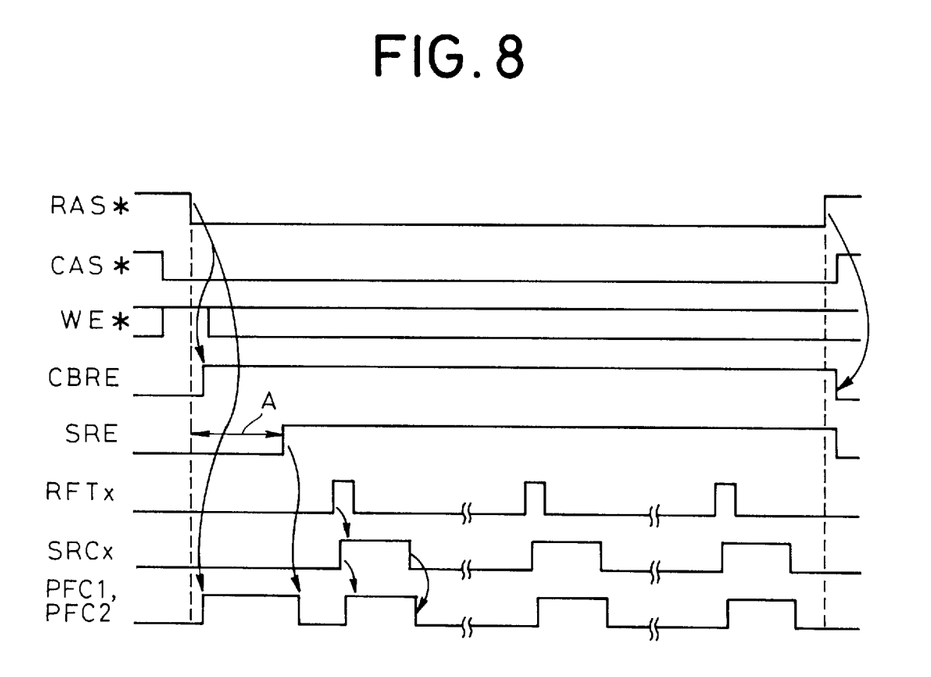
FIG. 8 is a timing chart of signals at respective portion for explaining the refreshing operation of the dynamic memory device shown in FIG. 7.

The refreshing control circuit 6x outputs a first refresh control signal RFC1 which becomes active level in response to variation of the row address control signal RAS* after detection of the CBR operation and inactive level in response to variation of the self-refreshing entry signal SRE into active level (or variation of one of the RAS* and the CAS* into inactive level, neglected from FIG. 8), and becomes active level in synchronism with the self-refreshing control signal SRCX when the self-refreshing entry signal SRE is active level and inactive level when the self-refreshing entry signal SRE is inactive, and a second refresh control signal RFC2 varying level variation similarly to the first refresh control signal, and in addition thereto, becomes active in synchronism with the active level of the row address control signal RAS*, for controlling the internal address generation circuit 7 and the row address control circuit 8.

The internal address generating portion 7 generates the internal address signal IAD sequentially updated address value in synchronism with the active level of the first refreshing control signal RFC1. The row address control circuit 8 selects the internal address signal IAD for synchronized with the first refreshing control signal RFC1 when the CBR operation is detected, according to first and second refreshing control signals RFC1 and RFC2, and selects the external address signal EAD in response to the active level of the row address control signal RAS* when the CBR operation is not detected. Namely, when the self-refreshing mode is executed, after detection of the CBR operation, CBR refreshing operation (once at the first time) is performed until the self-refreshing mode is detected (zone A shown in FIG. 8), and self-refreshing operation is performed after detection of the self-refreshing mode to perform refreshing by the internal address IAD in synchronism with the refreshing timing signal RFTx. If the CBR operation is detected but the self-refreshing mode is not detected, so called CBR refreshing operation is performed by the internal address signal IAD in synchronism with the row address control signal RAS*. When the CBR operation is not detected, normal refreshing operation is performed based in the external address signal EAD taken in synchronism with the row address control signal RAS*.

The self-refreshing mode in the dynamic memory device is frequently used when the power source is switched into a back-up power source and when the data holding condition becomes effected. It is thus desirable to make power consumption quite smaller even by prolonging the refreshing interval. Thus, in the foregoing dynamic memory device, in order to realize low power consumption, the refreshing interval of the self-refreshing mode is set long.

For example, in a 16 Mbit dynamic memory device, a refreshing interval in the normal operation is 32 ms. During this period, the refreshing cycle is 2048 (refreshing period about 16 μm). In the self-refreshing mode, the refreshing interval is longer than 300 ms(hereinafter referred to as over 300 ms). The refresh period, namely, the period of RFTx, SRCx, is longer than or equal to 150 μs (over 150 μs).

In the above-mentioned dynamic memory device, due to tolerance or so forth in the production stage, a provision in a refreshing interval (e.g. 300 ms) in the low power consumption type self-refreshing mode is not satisfied in many cases. In such cases, such a memory device is commercialized as a product without a self-refreshing function. Namely, the yield of the product with the self-refreshing function is generally not high.

On the other hand, a data holding period of the memory cell is variable depending upon fluctuation in the production stage, and is significantly influenced by the use environment, and particularly on environmental temperature. In order to permit use in the worst use condition, it is typical to shorten a refreshing interval in the self-refreshing mode. In such case, power consumption is increased.

Therefore, depending upon fluctuation in production stage and upon use environment, there has been proposed the dynamic memory device which varies refreshing interval in the self-refreshing mode. (For example, see Japanese Unexamined Patent Publication (Kokai) No. 3-59876, in which is disclosed a storage holding mode instead of the self-refreshing mode).

Figure 9:
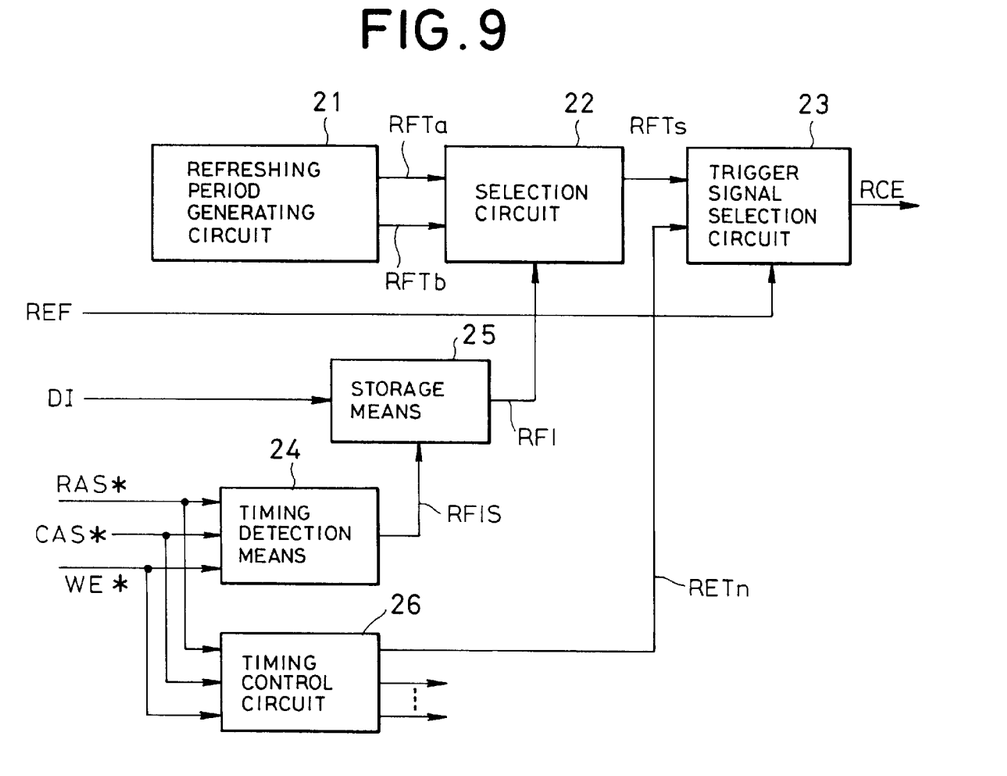
FIG. 9 is a block diagram of the second example of the conventional dynamic memory device.
Figure 10:
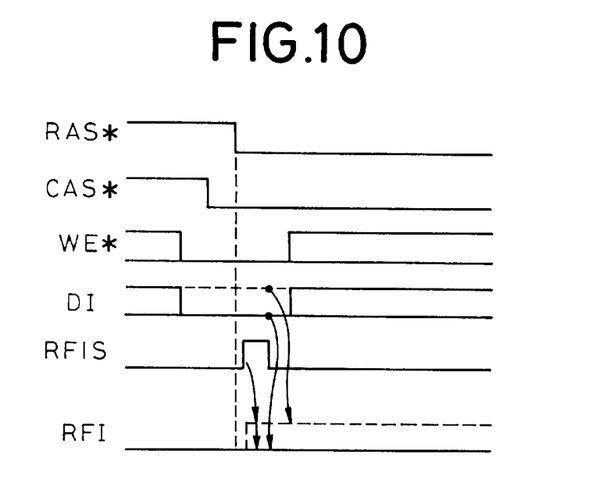
FIG. 10 is a timing chart showing signals in various portion for explaining a refreshing operation of the second example of the conventional dynamic memory device.

Block diagram of the dynamic memory device (second example) and timing chart of signals of respective portion are shown in FIGS. 9 and 10.

The shown dynamic memory device includes a refreshing period generating circuit 21 generating refreshing timing signals RFTa and RFTb of mutually different periods, a timing detecting means 24 outputting a refreshing information set signal RFIS by detecting the column address control signal CAS* and a write control signal WE* in active level (low level) at a timing where the row address control signal RAS* switches from inactive level (high level) to active level (low level), storage means 25 reading out and storing the level ("1" or "0") of the data signal DI according to the refreshing information set signal RFIS), a selection circuit 22 for selecting one of the refreshing timing signals REFTa and RFTb according to the level of the signal (refresh information RFI) stored in storage means 25, a timing control circuit 26 generating various timing signals including the refreshing timing signal RFTn in normal operation according to the row address control signal RAS*, the column address control signal CAS* and a write control signal WE*, and a trigger signal selection curcuit 23 selecting the refresh timing signal RFTs selected by the selection means 22 when the external storage holding mode signal REF is the storage holding mode, and outputting a refreshing start-up signal RCE with selecting the refreshing timing signal RFTn during normal operation while not in the storage holding mode. The address of the row address signal is sequentially updated according to the refreshing start-up signal RCE to perform refreshing operation of the memory cell array.

In this dynamic memory device, since the refreshing period in the storage holding mode can be determined depending upon the use condition, such as environmental temperature upon refreshing operation, characteristics determined in the production stage and level of the input data signal DI in consideration of the power consumption, or the like. Therefore, the power consumption can be reduced depending upon the use environment and the like.

The above-mentioned conventional dynamic memory device in the first example encounters the problems of low production and low yield of production with the self-refreshing function when longer refreshing period is provided for low power consumption type since the refreshing interval at the self-refreshing mode is fixed at a constant value, amount of the product becomes smaller, on the contrary when shorter refreshing period is provided, though yield in the products with the self-refreshing function can be improved, power consumption is increased. On the other hand, in the second example, since the refreshing interval can be selected depending upon use environment or so forth, power consumption can be reduced and yield in production can be improved. However, four external signals DI, RAS*, CAS* and WE* are required for selecting the refreshing interval. Therefore, signal control becomes complicated. Also, the level of the external data signal is determined in consideration of the characteristics of the environmental temperature and upon production, power consumption and so forth. Thus, it is possible that errors on setting of level of the data signal occur, and cause erasure of the stored data.

SUMMARY OF THE INVENTION

It is an object of the present invention to provide a dynamic memory device and a driving method therefor, which can reduce number of external control signal for selecting a refreshing interval for simplifying signal control therefor, increase number of products with self-refreshing function including low power consumption type, improve yield of product, and can avoid possibility of erasure of the stored data.

According to one aspect of the invention, a dynamic memory device comprises:

a refreshing timing signal generating portion for generating first and second refreshing timing signal having mutually different periods;

refreshing timing selection means for detecting a time difference of level variation timing of two or three external control signals and generating a refreshing timing selection signal of selected one of first and second levels depending upon the time difference;

selector for selecting one of the first and second refreshing timing signal depending upon the level of the refreshing timing selection signal;

self-refreshing detecting means for detecting a time condition of level variation timing of a plurality of external control signals and generating an active level self-refreshing entry signal; and an internal address generating means for generating an internal address signal sequentially updated an address value in synchronism with the refreshing timing signal selected by the selector while the self-refreshing entry signal is in active level.

The external control signals may be a row address control signal (RAS*) and a column address control signal (CAS*), the refreshing timing selection means may comprise a circuit generating the refreshing timing selection signal having one of the first and second levels by depending upon an elapsed period from a variation timing of the row address signal (RAS*) switched into active level to a variation timing of the column address signal (CAS*) switched into inactive level, in the condition where when the row address control signal (RAS*) is varied from the inactive level into the active level, the column address control signal (CAS*) is in active level. In such case, the refreshing timing selecting means may comprises:

- CBR operation detecting means for detecting whether the column address control signal (CAS*) is active level or not when the row address control signal (RAS*) is varied from the inactive level to the active level; Clock signal outputting means for outputting a predetermined clock signal when active level of the address control signal (CAS*) is detected by the CBR operation detecting means; and
- Selection signal outputting means receiving the output of the CBR operation detecting means, output of the clock signal generating means and the column address control signal (CAS*), for outputting a selection signal on the basis of the inputs.

In the alternative, the external control signals may be a row address control signal (RAS*), a column address control signal (CAS*) and a writing control signal (WE*), and the reflecting timing selection means may comprise a circuit generating the refreshing timing selection signal having one of the first and second levels by depending upon an elapsed period from a variation timing of the row address signal (RAS*) switched into active level to a variation timing of the writing control signal (WE*) switched into active level, in the condition where when the row address control signal (RAS*) is varied from the inactive level into the active level, the column address control signal (CAS*) is in active level and said writing control signal is in inactive level. The refreshing timing selecting means may comprises:

- CBR operation detecting means for detecting whether the column address control signal (CAS*) is active level or not when the row address control signal (RAS*) is varied from the inactive level to the active level; Clock signal outputting means for outputting a predetermined clock signal when active level of the address control signal (CAS*) is detected by the CBR operation detecting means; and
- Selection signal outputting means receiving the output of the CBR operation detecting means, output of the clock signal generating means and the writing control signal (WE*), for outputting a selection signal on the basis of the inputs.

The self-refreshing detecting means may detect self-refreshing when the row address control signal (RAS*) is varied from the inactive level to the active level, and the column address control signal (CAS*) may be in active level, and after expiration of a predetermine period from the variation timing, both of the row address control signal (RAS*) and the column address control signal (CAS*) maintains active level. The self-refreshing detecting means may comprise:

- time measuring means for measuring a predetermined period from a variation timing when the row address control signal (RAS*) is varied from the inactive level to the active level while the column address control signal (CAS*) is in active level; and
- detection result outputting means receiving a signal output from the time measuring means upon expiration of the predetermined period, and responsive to the signal for detecting whether both of the row address control signal (RAS*) and the column address control signal (CAS*) are held in active level or not.

The dynamic memory device may further comprise refreshing control means for generating an internal address signal synchronized with the selected refreshing timing signal when the self-refreshing entry signal is active, and an internal address signal synchronized with the external control signal when the self-refreshing entry signal is inactive.

According to another aspect of the invention, a driving method for a dynamic memory device comprises the steps of:

- generating first and second refreshing timing signal having mutually different period;
- generating different levels of selection signals detecting a time difference of a level variation timing of two or three external control signals;
- selecting one of the first and second refreshing timing signal depending upon the level of the selection signal;
- detecting the current mode being the self-refreshing mode;
- generating an internal address signal sequentially updated address value in synchronism with one of the first and second refreshing timing signals; and controlling refreshing operation for a memory cell array by the internal address signal.

The driving method for a dynamic memory device may further comprise steps of:

- measuring a data holding period of the memory array;
- classifying the produces into a group having long data holding period and a group having short data holding period;
- driving the dynamic memory device with defining the external control signal to have level variation timing for selecting one of first and second refreshing timing signal having longer period for the product included in the group having longer data holding period; and
- driving the dynamic memory device with defining the external control signal to have level variation timing for selecting one of first and second refreshing timing signal having shorter period for the product included in the group having shorter data holding period.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to be present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid obscuring the present invention.

Figure 1:
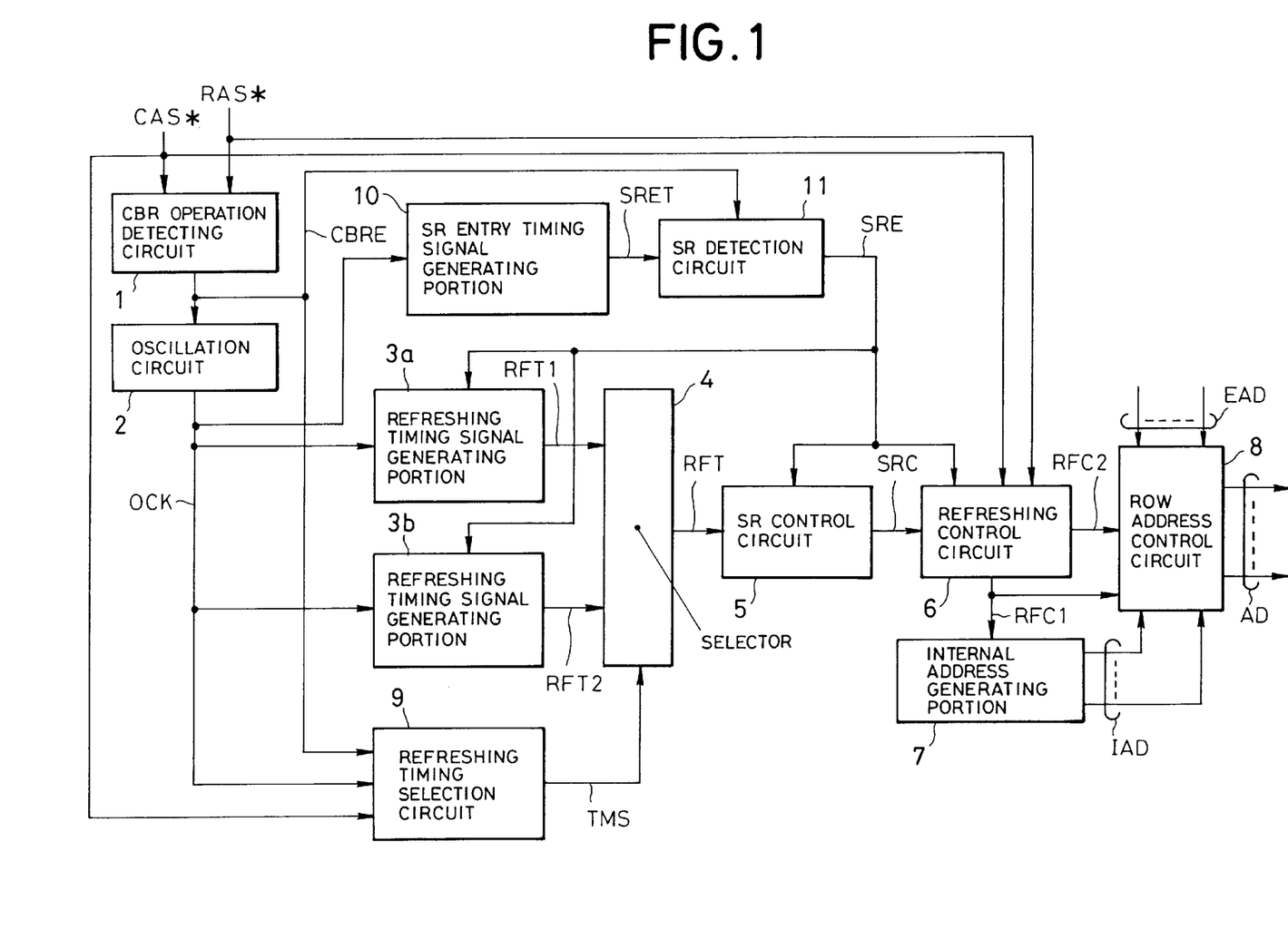
FIG. 1 is a block diagram showing the first embodiment of a dynamic memory device according to the present invention.

FIG. 1 is a block diagram showing one embodiment of a dynamic memory device according to the present invention.

The first embodiment of the dynamic memory device is differentiated from the conventional dynamic memory device (first example) in that, in place of the refreshing timing signal generating portion 3x, first and second refreshing timing signal generating portions 3a and 3b generating first and second refreshing timing signals RFT1 and RET2 having mutually different periods, a refreshing timing selection circuit 9 generating a refreshing timing selection signal TMS taking one of first and second levels depending upon long or short of a period from a variation timing of the row address control signal RAS* from inactive level to active level as the CBR operation is detected, to a variation timing of the column address signal CAS* from active level to inactive level, and a selector 4 for selecting one of the first and second refreshing timing signals RFT1 and RFT2 depending upon the level of the refreshing timing selection signal TMS. It should be noted that the CBR operation detecting circuit 1, 1x and the refreshing control circuit 6, 6x are different in level variation timings of the row address control signal RAS* and the column address control signal CAS* in the shown embodiment and the first example of the prior art, and the circuit constructions are slightly differentiated. However, the basis function are completely the same to each other.

Namely, the first embodiment varies the period of the refreshing timing signals (RFT1 and RFT2) depending upon a time difference of variation timing of the column address control signal CAS* into inactive level after detection of the CBR operation, to perform self-refreshing operation.

In the first embodiment, respective periods of the first and second refreshing timing signals RFT1 and RFT2 are set at about 16 μs corresponding to a refreshing interval of 32 μs (2028 cycles) and over 150 μm corresponding to a low power consumption type refreshing interval of 300 ms, in case of 16 Mbit, for example. A period from a timing varying the row address control signal RAS* into active level and to a timing varying the column address control signal CAS* into inactive level is set to about 10 μs for selection of the refreshing period of 16 μs (RFT1) and about 100 μs for selection of the refreshing period over 150 μs. A reference period for selecting these are set about 10 μs from detection of the CBR operation.

Figure 2:
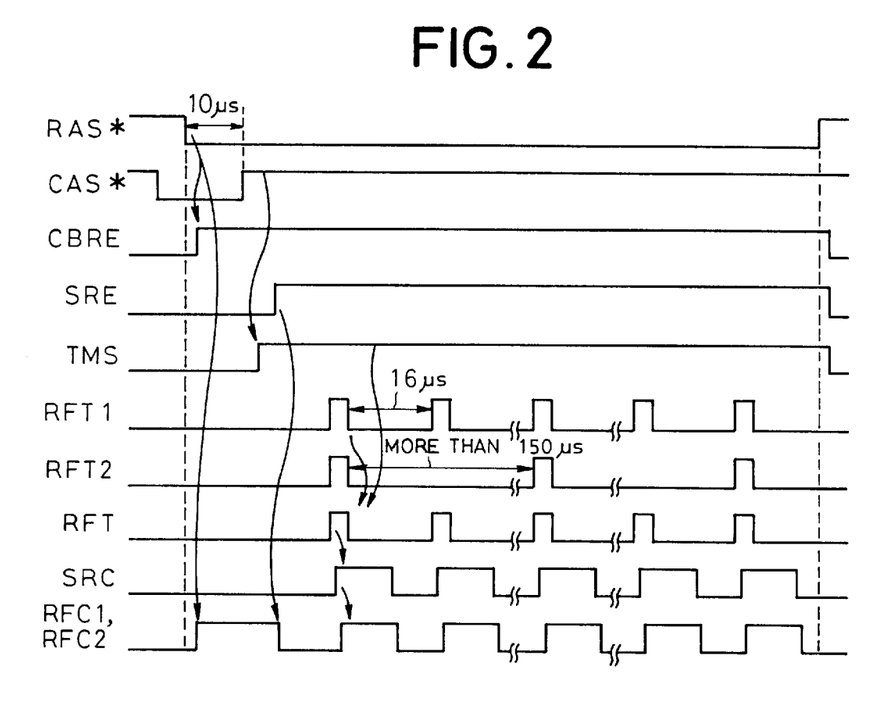
FIG. 2 is a timing chart showing signals in various portion for explaining a refreshing operation and driving method of the dynamic memory device of FIG. 1.

Concerning refreshing operation in the first embodiment set as set forth above, discussion will be given with reference to the timing chart of signals at variation portion shown in FIGS. 2 and 3.

At first, when the CBR operation is detected by the CBR operation detecting circuit 1, the CBR entry signal CBRE becomes active level. Then, the oscillation circuit 2 initiate oscillation to output the oscillation clock signal OCK.

The SR entry timing signal generating portion 10 and the SR detecting circuit 11 outputs the self refreshing entry signal SRE of active level after expiration of a predetermined period after entry of the CBR operation similarly to the first example of the prior art. The refreshing timing signal generating portions 3a and 3b are active in response to the active level of the self-refreshing entry signal SRE to count the oscillation clock signal OCK to generate the predetermined period (3a is 16 μs and 3b is over 300 μs) of the refreshing timing signals RFT1 and RFT2.

On the other hand, the refreshing timing selection circuit 9 makes judgment of the level of the column address control signal CAS* at a timing expiration of about 10 μs after entry of the CBR operation to generate the refresh timing selection signal TMS which becomes high level (first level, see FIG. 2) when the column address control signal CAS* is inactive level (high level), and low level (second level, see FIG. 3) when the column address control signal CAS* is active level (low level). The selector 4 selects the refreshing timing signal RFT1 of a period of 16 μm when the refreshing timing selection signal TMS is high level, and the refreshing timing signal RFT2 of the period over 300 μs when the refreshing timing selection signal TMS is low level.

Hereinafter, similarly to the first example of the prior art, by the SR control circuit 5, the self-refreshing control signal SRC in synchronism with the refreshing timing signals (RFT1, RFT2) and having set pulse width is output. After detection of the CBR operation by the refreshing control circuit 6, the internal address generating portion 7 and the row address control circuit 8, CBR operation is performed until entry into the self-refreshing mode (only first time), self-refreshing mode is performed after entry into the self-refreshing mode, CBR refreshing operation is detected when the self-refreshing mode is not detected after detection of the CBR operation. When the CBR operation is not detected, normal refreshing operation is performed by the row address control signal RAS* and the external address signal EAD.

Next, the driving method of the first embodiment of a dynamic memory device will be discussed with reference to the flowchart of FIG. 4.

At first, a data holding period of the memory cell array (neglected from FIG. 1) of the first embodiment of the dynamic memory device is measured (S1). The data holding period is discriminated between a group of the periods which can guarantee the low power consumption type refreshing interval of about 300 μs and a group of the periods which cannot guarantee (S2) to make them as separate products. Hereinafter, the former will be referred to as a product with a low power consumption type self-refreshing function and the latter will be referred to as a product with a normal self-refreshing function.

Figure 3:
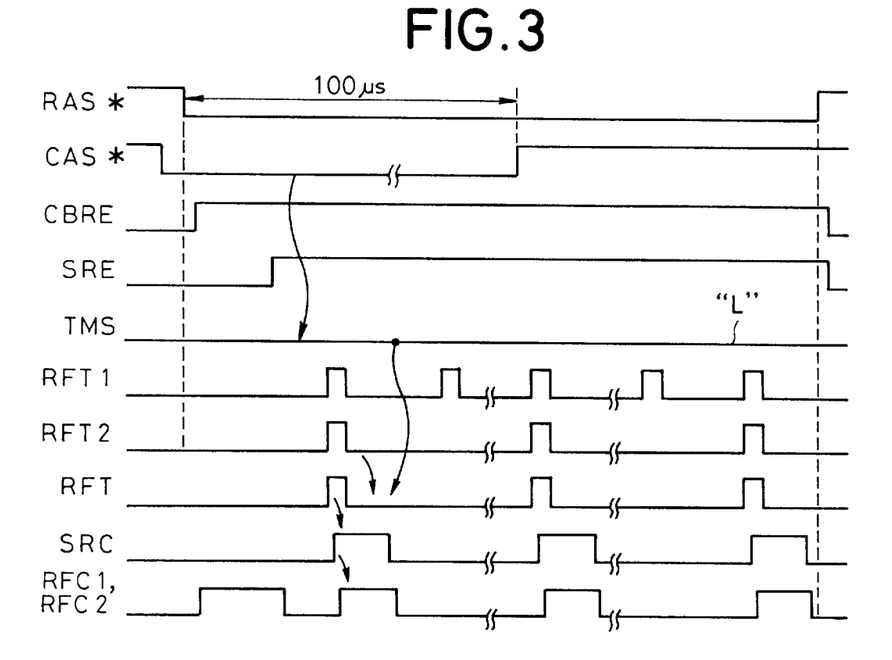
FIG. 3 is a timing chart showing signals in various portion for explaining a refreshing operation and driving method of the dynamic memory device of FIG. 1.
Figure 4:
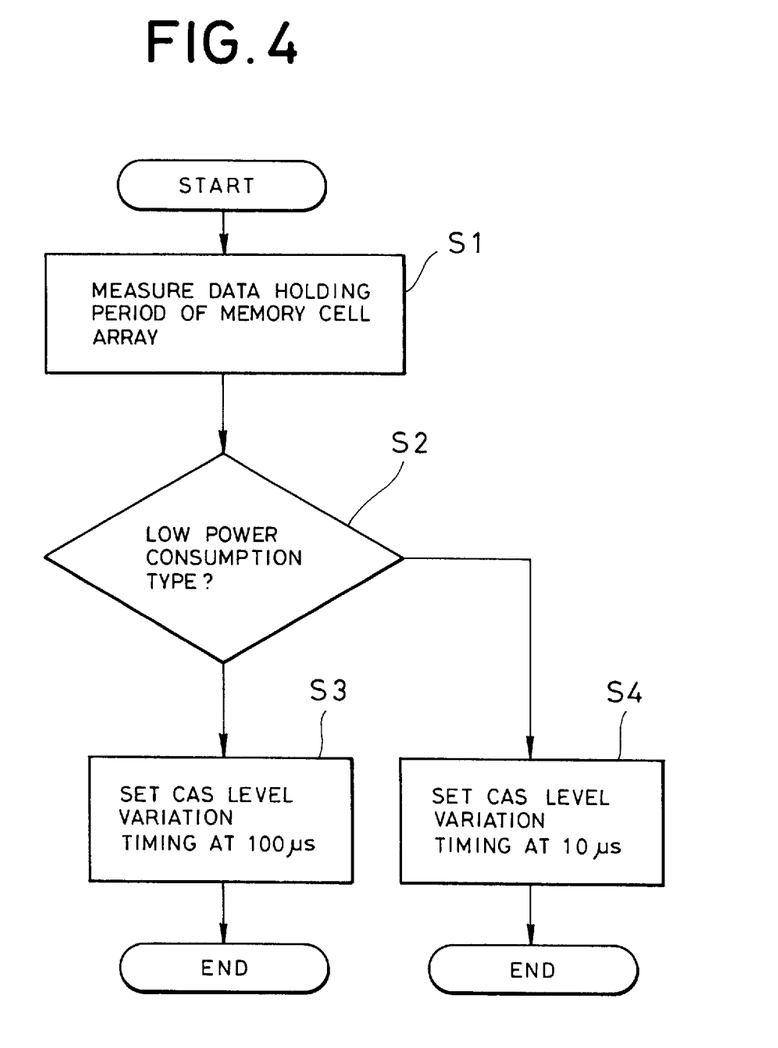
FIG. 4 is a flowchart showing a driving method of the dynamic memory device.

Next, with respect to the produce with the low power consumption type, as shown in FIG. 3, the level variation timing of the row address control signal RAS* and the column address control signal CAS* upon execution of the self-refreshing mode is defined as a period from a timing of variation of the row address control signal RAS* into the active level to a timing of variation of the column address control signal CAS* into the inactive level, after CBR operation, e.g. 100 μs (S3), as shown in FIG. 3 and 4. On the other hand, with respect to the product with the normal self-refreshing function, 10 μs (s4) is defined as shown in FIG. 2 and 4.

Then, with the row address control signal RAS* and the column address control signal CAS* thus defined, the corresponding product (dynamic memory device) is driven.

As a result, in the product with the low power consumption type self-refreshing function, the low level refreshing timing selection signal TMS is output from the refreshing timing selection circuit 9, the refreshing timing signal RFT2 over the refreshing period over 300 μs is selected to execute the self-refreshing operation. Thus, power consumption during self-refreshing operation can be reduced. On the other hand, in the product with the normal self-refreshing function, high refreshing timing selection signal is output from the refreshing selection circuit 9, the refreshing timing signal RFT1 having the refreshing period of 16 μs is selected to execute the self-refreshing operation. In this case, while power consumption during self-refreshing operation becomes large, it becomes unnecessary to externally perform level control of the control signal for refreshing. Namely, since the refreshing period is switched depending upon variation timing of the column address control signal CAS* into inactive level, such control signal (data signal DI shown in FIG. 9) becomes unnecessary.

In the first embodiment of the dynamic memory device and the driving method, the external control signals for selecting the refreshing interval and the period are the row address control signal RAS* and the column address control signal CAS*, which is half in comparison with the second example of the prior art, in which the control signals are four of RAS*, CAS*, WE; and DI. Therefore, the signal control can be simplified. Also, since the products with the self-refreshing function become two kinds of the low consumption power type and normal type, and number of the products with the self-refreshing function can be increased to improve yield. On the other hand, since the level variation timing of the control signal for selecting the refreshing interval and the period, and so forth are defined per each products, complexity to determine the signal level in consideration of various condition as in the second example of the prior art, can be avoided. Error in setting of the signal level and possibility of loss of the storage data can be avoided.

Figure 5:
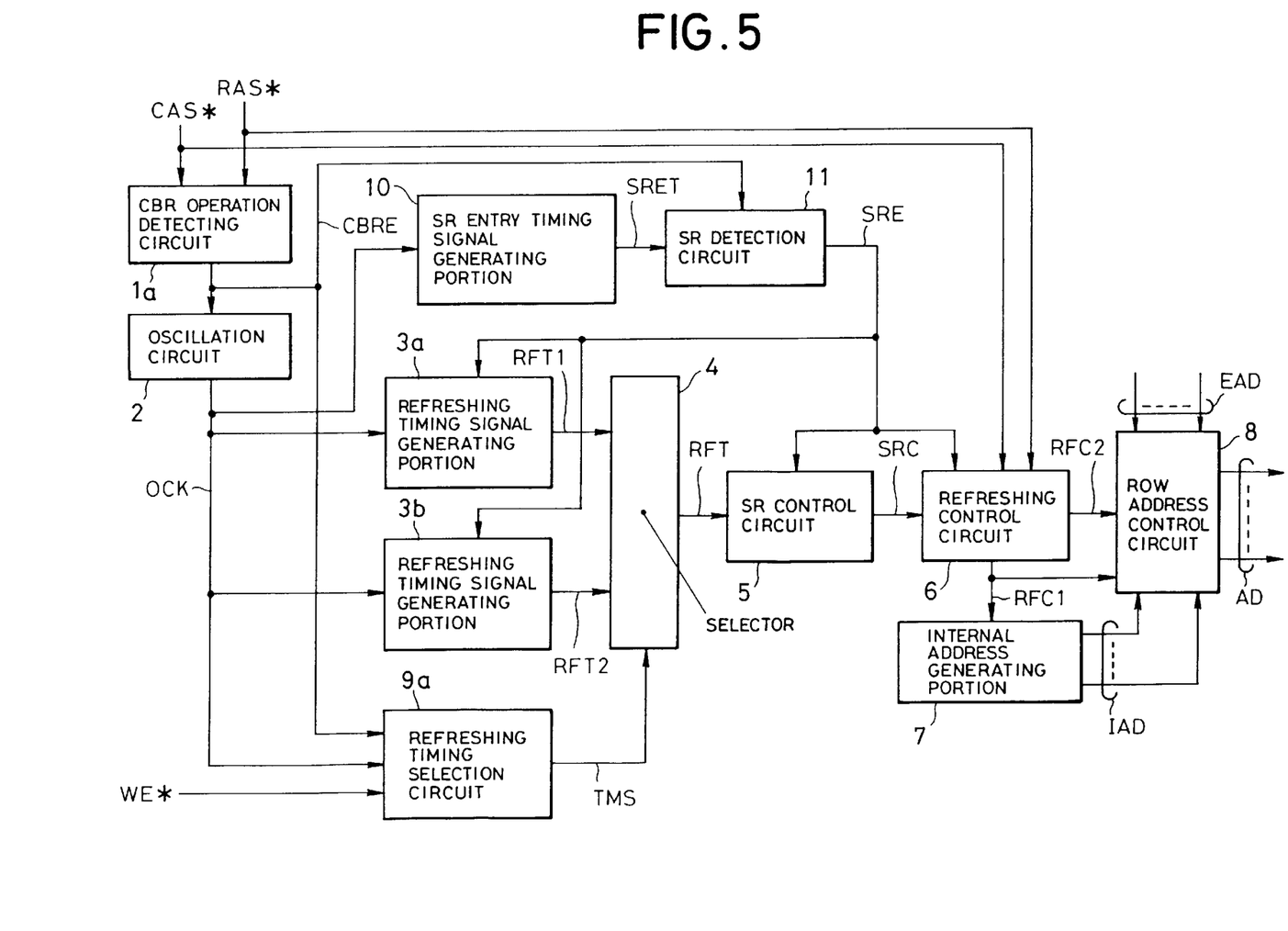
FIG. 5 is a block diagram showing the second embodiment of a dynamic memory device according to the present invention.
Figure 6:
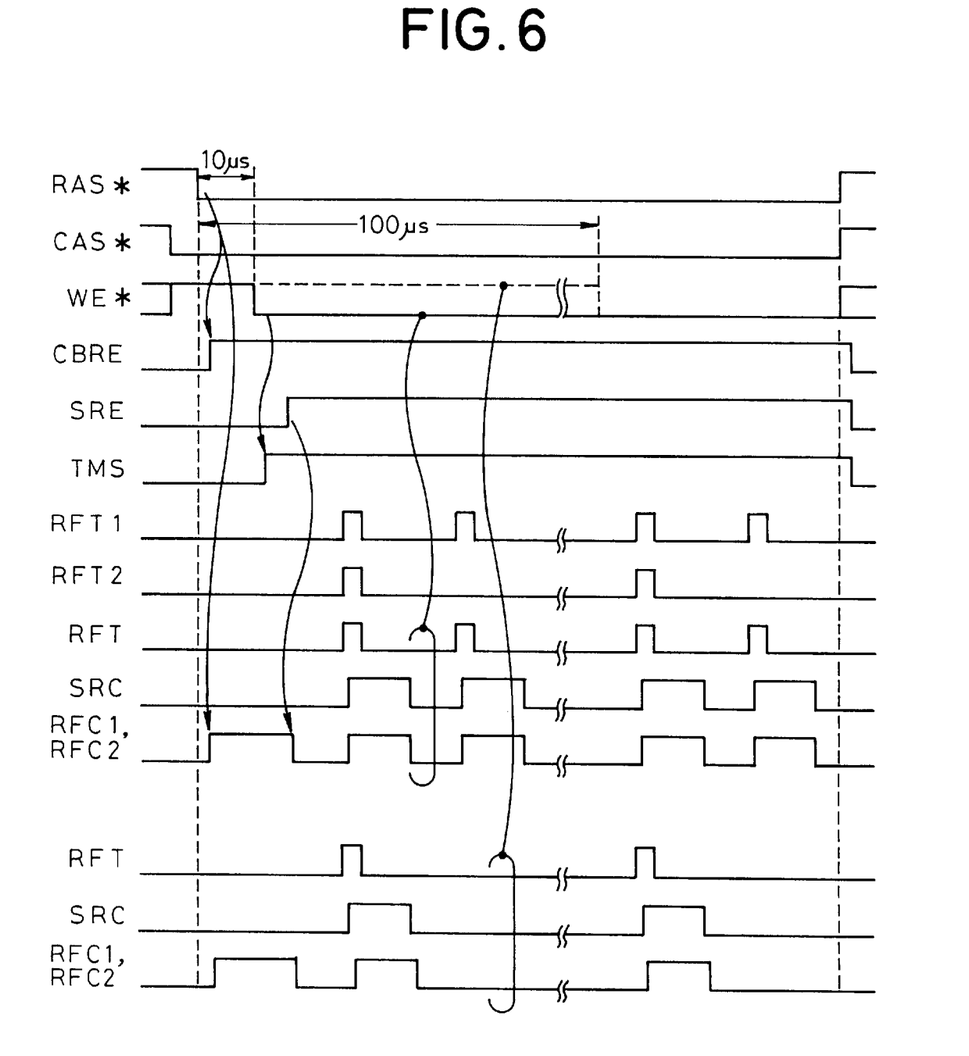
FIG. 6 is a timing chart showing signals in various portion for explaining a refreshing operation and driving method of the dynamic memory device of FIG. 5.

FIG. 5 is a block diagram showing the second embodiment of the dynamic memory device according to the present invention, and FIG. 6 is a timing chart showing signals in various portion for explaining the second embodiment of the dynamic memory device and the driving method therefor.

The second embodiment is differentiated from the first embodiment in that while the selection of the refreshing interval and the period is done depending upon difference of the level variation timing of the column address control signal CAS* into the inactive level after detection of the CBR operation, in the first embodiment, the shown embodiment selects the refreshing interval and the period depending upon a difference of the level variation difference of the writing control signal WE* from inactive level to active level.

Namely, in place of the refreshing timing selection circuit 9, there is provided a refreshing timing selection circuit 9a which outputs high level when the writing control signal WE* is low level and low level when the writing control signal WE* is high level after expiration of the predetermined period (e.g. 10 μs) after entry into the CBR operation. A CBR operation detecting circuit 1a and a refreshing control circuit 6a are slightly different in circuit construction from that in the first embodiment for difference of level variation of the column address control signal CAS*. However, the basic function is completely identical.

In the second embodiment, at the CBR detection timing, the write control signal WE* is in inactive level of high level. Then, the variation timing of the write control signal WE* into active level, in case of the product with the low power consumption type self-refreshing function, 100 μs from the active level variation timing of the row address control signal RAS*, and in case of the product with the normal self-refreshing function, about 10 μs is set. Even in the first embodiment and the first example of the prior art or so forth, while the write control signal WE* is high level (inactive level) at the timing of detection of the CBR operation, the period is normally in ns order. Therefore, 10 μs, 100 μs and so forth can be easily detected.

The refreshing operation and the driving method in the second embodiment are basically the same as the first embodiment except that the selection of the refreshing period (interval) is selected depending upon the write control signal WE*. Therefore, further discussion will be neglected in order to keep the disclosure simple enough for facilitating clear understanding of the invention. It should be obvious that the same effect to the first embodiment can be achieve by the shown embodiment.

As set forth above, the present invention is constructed such that first and second refreshing timing signals having mutually different periods, one of the first and second refreshing timing signals is selected depending upon a time difference of level variation timing of external two or three control signals, and refreshing operation of the memory cell array is performed according to the internal address value updated the address values sequentially in synchronism with the selected refreshing timing when the self-refreshing mode. On the other hand, by measuring the data holding period of the memory cell array, the products are discriminated between long holding timing group and short holding time as mutually different products. Level variation timings of the external control signals for selecting the refreshing periods in the self-refreshing modes in respective of the long holding timing group products and the short holding time products are defined in terms of the data holding period. The products are driven with the control signals thus defined. Therefore, number of external control signals required for selecting the refreshing period (interval) can be reduced to permit simplification of signal control. Also, since the products (dynamic memory devices) with the self-refreshing functions are classified into two kinds, i.e. low power consumption type and normal type, number of the products with the self-refreshing function can be increased and yield in production of such products can be improved. Furthermore, since the level variation timing of the external control signal for selecting the refreshing period (interval) for each class of products and the devices are driven with such control signals. Complexity as that in the prior art which requires determination of the signal level in consideration of various conditions, can be avoided. In addition, possibility of causing error in setting the signal level can be eliminated, and of erasure storage data can be avoided.

While the present invention has been discussed in detail hereinabove in terms of the specific preferred embodiments of the present invention, various details in the shown embodiments should be considered not essential but can be modified, neglected or replaced with equivalents in various ways. Therefore, the present invention should be understood to include all possible modifications, changes and substitutions which could be done without departing from the principle of the present invention.

What is claimed is:

1. A dynamic memory device receiving external control signals, including a CAS signal and a RAS signal, each of said external control signals having a respective level, said device comprising:

self-refreshing detecting means for producing a self-refreshing entry signal after making a detection of a CAS before RAS operation;

a refreshing timing signal generator generating a first refreshing timing signal and a second refreshing timing signal, each with a different respective period;

refreshing timing selection means for generating a refreshing timing selection signal based upon the difference in time between said CAS before RAS operation and a change in said respective level of only one of said external control signals;

a selector selecting, as a selected refreshing timing signal, one of said first refreshing timing signal and said second refreshing timing signal based on said refreshing timing selection signal; and internal address generating means for sequentially generating and updating, in the presence of said self-refreshing entry signal, and in synchronism with said selected refreshing timing signal, an address value of an internal address signal.

2. A dynamic memory device as set forth in claim 1, wherein said change in said respective level of only one of said external control signals is a change in said CAS signal from an active level to an inactive level.

3. A dynamic memory device as set forth in claim 2, wherein said refreshing timing selecting means comprises:

CBR operation detecting means for detecting said CAS before RAS operation when said respective level of said CAS signal is already active when said respective level of said RAS signal varies from inactive to active;

clock signal outputting means for outputting a predetermined clock signal when said respective level of said CAS signal is active; and selection signal outputting means outputting a selection signal based on the output of said CBR operation detecting means, said predetermined clock signal, and said CAS signal.

4. A dynamic memory device as set forth in claim 1, wherein;

said external control signals include a writing control signal and said change in said respective level of only one of said external control signals is a change in said writing control signal from an inactive level to an active level.

5. A dynamic memory device as set forth in claim 4, wherein said refreshing timing selecting means comprises:

CBR operation detecting means for detecting said CAS before RAS operation when said respective level of said CAS signal is already active when said respective level of said RAS signal varies from inactive to active;

clock signal outputting means for outputting a predetermined clock signal when said respective level of said CAS signal is active; and selection signal outputting means outputting a selection signal based on the output of said CBR operation detecting means, said predetermined clock signal, and said writing control signal.

6. A dynamic memory device as set forth in claim 1, wherein said self-refreshing detecting means produces said self-refreshing entry signal after a predetermined period of time following said detection of said CAS before RAS operation.

7. A dynamic memory device as set forth in claim 1, wherein said self-refreshing detecting means comprises:

time measuring means for measuring a predetermined period from said detection of said CAS before RAS operation and outputting a time measuring signal; and detection result outputting means responsive to said time measuring signal to detect whether both of said RAS signal and said CAS signal are held in an active level.

8. A dynamic memory device as set forth in claim 1, which further comprises refreshing control means for generating an internal address signal synchronized with the selected refreshing timing signal when said self-refreshing entry signal is active, and an internal address signal synchronized with the external control signal when said self-refreshing entry signal is inactive.

9. A driving method for a dynamic memory device comprising the steps of:

generating first and second refreshing timing signals having mutually different periods;

generating different levels of selection signals detecting a time difference of a level variation timing of only one of a plurality of external control signals;

selecting one of said first and second refreshing timing signal depending upon the level of said selection signal;

detecting the current mode being the self-refreshing mode;

generating an internal address signal sequentially updated address value in synchronism with one of said first and second refreshing timing signals; and controlling refreshing operation for a memory cell array by said internal address signal.

10. A driving method for a dynamic memory device products comprising the steps of:

generating first and second refreshing timing signals having mutually different periods:

generating different levels of selection signals detecting a time difference of a level variation timing of two or three external control signals;

selecting one of said first and second refreshing timing signal depending upon the level of said selection signal;

detecting the current mode being the self-refreshing mode;

generating an internal address signal sequentially updated address value in synchronism with one of said first and second refreshing timing signals;

controlling refreshing operation for a memory cell array by said internal address signal;

measuring a data holding period of said memory array;

classifying said products into groups, including a group having a long data holding period and a group having a short data holding period shorter than said long data holding period;

driving the dynamic memory device with defining the external control signal to have level variation timing for selecting one of first and second refreshing timing signal having a longer period for the products included in said group having said long data holding period; and driving the dynamic memory device with defining the external control signal to have level variation timing for selecting one of first and second refreshing timing signal having a shorter period for the products included in said group having said short data holding period.

* * * * *

UNITED STATES PATENT AND TRADEMARK OFFICE
CERTIFICATE OF CORRECTION

PATENT NO. : 5,862,093
DATED : January 19, 1999
INVENTOR(S) : Kenichi SAKAKIBARA It is certified that error appears in the above-identified patent and that said Letters Patent is hereby corrected as shown below:

On the title page, :

Insert --Foreign Application Priority Data, Nov. 24, 1995 Japan 305341/1995--

Column 1, Line 49 delete "SRCX" and insert --SRCx--

Column 2, Line 22 delete "SRCX" and insert --SRCx--

Column 2, Line 32 delete "SRCX" and insert --SRCx--

Column 3, Line 51 delete "REFTa" and insert --RFTa--

Column 5, Line 8 delete "comprises" and insert --comprise--

Column 5, Line 35 delete "comprises" and insert --comprise--

Column 5, Line 54 delete "predetermine" and insert --predetermined--

Column 6, Line 13 delete "period" and insert --periods--

UNITED STATES PATENT AND TRADEMARK OFFICE
CERTIFICATE OF CORRECTION

PATENT NO. : 5,862,093
DATED : January 19, 1999
INVENTOR(S) : Kenichi SAKAIBARA

It is certified that error appears in the above-identified patent and that said Letters Patent is hereby corrected as shown below:

Column 6, Line 30 delete "produces" and insert --products--

Column 6, Line 50 delete "be and insert --the--

Column 7, Line 36 delete "RET2" and insert --RFT2--

Column 7, Line 63 delete "µs" and insert --µm--

Column 8, Line 12 delete "initiate" and insert --initiates--

Column 9, Line 9 delete "(s4)" and insert --(S4)--

Column 9, Line 42 delete "WE;" and insert --WE*,-

Column 10, Line 43 delete "achieve" and insert --achieved--

Column 12, Line 60 delete "products" and insert --product--

Signed and Sealed this

Sixth Day of July, 1999

Q. TODD DICKINSON

*Attest:*

*Attesting Officer*  Acting Commissioner of Patents and Trademarks